United States Patent [19]

Horr et al.

[11] E Re. 30,601

[45] Reissued May 5, 1981

[54] ALIGNMENT APPARATUS

[75] Inventors: Andrew F. Horr; William F. White, both of Essex Junction, Vt.

[73] Assignee: International Business Machines Corporation, Armonk, N.Y.

[21] Appl. No.: 968,053

[22] Filed: Dec. 11, 1978

Related U.S. Patent Documents

Reissue of:

[64] Patent No.: 4,093,378
Issued: Jun. 6, 1978
Appl. No.: 737,819
Filed: Nov. 1, 1976

[51] Int. Cl.[3] ..... G03B 27/62; G03B 27/64

[52] U.S. Cl. ..... 355/76; 269/21; 308/9; 355/53; 355/54; 356/144

[58] Field of Search ..... 355/53, 54, 78, 86, 355/76, 95, 75, 73; 356/144, 172; 308/9; 269/21; 250/201, 221, 237

[56] References Cited

U.S. PATENT DOCUMENTS

| | | | |
|---|---|---|---|
| 2,968,994 | 1/1961 | Shurcliff | 355/56 |
| 3,674,368 | 7/1972 | Johannsmeier | 355/78 |
| 3,722,996 | 3/1973 | Fox | 355/54 X |
| 3,858,978 | 1/1975 | Johannsmeier | 355/79 |
| 3,876,301 | 4/1975 | Kosugi et al. | 355/53 |
| 3,940,211 | 2/1976 | Johannsmeier | 355/53 |
| 3,955,072 | 5/1976 | Johannsmeier et al. | 355/86 X |
| 4,068,947 | 1/1978 | Buckley | 355/72 |

OTHER PUBLICATIONS

IBM Technical Disclosure Bulletin, "Semiconductor Leveling System", J. W. Buechele, vol. 16, No. 10, Mar. 1974, pp. 3255-3256.

*Primary Examiner*—Richard A. Wintercorn
*Attorney, Agent, or Firm*—Francis J. Thornton

[57] ABSTRACT

This describes an apparatus and method especially adapted for positioning a semiconductor wafer in a preferred plane with respect to a photomask so as to achieve improved photolithographic focusing. The apparatus comprises a holder, provided with a surface for receiving a semiconductor wafer thereon, mounted in a chuck which mates with an adaptor ring containing both driver mechanisms and sensors for sensing and positioning the wafer. The sensors define a reference plane and converts the spacing between the reference plane and the front surface of the semiconductor wafer into electrical signals which can be fed to the driver mechanisms to position, with both rotational or translational motion, the plane of the wafer by moving the holder until all the signals from the sensors are nulled. Once the wafer is properly aligned, the sensors continually monitor the position of the wafer and the driver mechanisms continually provide loading to the wafer holder to continually maintain the wafer in its preferred position with respect to the established reference plane.

9 Claims, 3 Drawing Figures

ALIGNMENT APPARATUS

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates generally to an apparatus for accurately aligning first and second elements. More specifically, it relates to an apparatus for accurately aligning such elements without contacting the surface of the elements being aligned.

2. Description of the Prior Art

In the manufacture of integrated circuits, after a semiconductor wafer has been lapped and polished and a coating of photoresist placed upon the wafer a pattern is exposed on the photoresist by projecting light through a mask, the mask having the necessary indicia thereon. As devices become reduced in physical size and as their number has increased in the individual chips on the wafer, alignment of the wafer to the mask becomes more and more critical, for as the density of devices increase it becomes necessary to increase line and edge definition and to eliminate as much as possible areas caused by misfocusing.

Wafer to mask alignment devices are well known to the prior art. For example, U.S. Pat. No. 3,645,622 issued Feb. 29, 1972, and U.S. Pat. No. 3,711,081 issued Jan. 16, 1973, both of which are assigned to the same assignee as the present invention, describes apparatus and methods for aligning a semiconductor wafer to a photomask in which a photomask is mounted in a fixed superimposed overlapping position relative to a gimbal supporting a semiconductor wafer. The gimbal is arranged such that it can be raised up to force the wafer against the mask to align the plane of the mask and the wafer. After this forcing together of the mask and the wafer, the wafer is removed a fixed distance below the mask for photoalignment.

An article appearing in the IBM Technical Disclosure Bulletin Vol. 14, No. 5, October 1971 on page 1604 and 1605 describes still another technique for wafer adjustment. In this apparatus there is disclosed a contactless, plane parallel adjustment of wafers to a mask in which an adjusting plate is interposed between the mask and the wafer so that the wafer can be moved by forcing an air jet against the surface of the wafer until the gimbal upon which the wafer rests is adjusted. Once the wafer is set by the air jet with respect to the adjusting plate, the gimbal is locked, the adjusting plate is removed and the entire apparatus moved towards the rigidly held mask until it is in a preferred position and a selected distance from the rigidly held mask.

Each of these disclosed inventions, though obviously providing significant advances over the prior art, have drawbacks. For example, in the described patents which require direct contact with the face of the wafer which is coated with a photoresist layer, the apparatus used to adjust and position the wafer, will also become coated with photoresist. Because such accumulations of photoresist, on the apparatus, is uncontrolled they will eventually cause the wafer to be positioned divergent from the mask and the desired parallelism of the wafer with the mask is not realized. Moreover, if particles are trapped between the wafer and the holder they can when the wafer is pushed against the mask, seriously damage either the mask or the wafer.

In the apparatus described in the described Technical Disclosure Bulletin there are potential errors possible because of the complex mechanical movements required. Moreover, in neither case are means provided for continuously maintaining parallelism between the wafer and the mask.

SUMMARY OF THE INVENTION

The present invention describes an improved tool for positioning and maintaining an object in a selected attitude with respect to a reference plane without requiring contact between the object and the reference plane.

A further object of the invention is to describe a complete positioning apparatus in which parallelism between the surface of an object and a reference plane can be continuously monitored and achieved.

The present invention also describes an improved photomask semiconductor wafer photoalignment tool which not only achieves parallelism between a semiconductor wafer and the reference plane but also avoids contacting the photoresist coated surface of the wafer thereby permitting significantly increased resolutions not achievable by the prior art.

A still further object of the invention is also to provide a photoalignment tool in which the photoresist coated surface of the wafer is not physically touched with any portion of the photoalignment tool thus avoiding the possibility of contamination of the surfaces and errors induced by such an accumulation of photoresist on the contacting surfaces.

Still another object of the invention is to describe an apparatus for positioning a semiconductor wafer at a preferred plane with respect to a mask to improve the photolithographic focusing techniques in which the surface of the wafer can be constantly monitored and positioned thereby compensating for undulations in the wafer surface during scanning operations.

These and other objects of the present invention are achieved by employing an alignment tool for positioning an object in a predetermined attitude with respect to a reference plane. When the object is a semiconductor wafer provided with relatively thin photoresist the preferred apparatus is such that the wafer is placed upon a gimbal, mounted in a housing, which housing will mate with a vacuum adaptor ring. The vacuum adaptor ring fixedly holds the housing and positions spaced driver mechanisms adjacent to spaced contact points on the gimbal and positions spaced sensors adjacent the surface of the wafer. The sensors define a reference plane and measure the distance the wafer is from this reference plane and provides a signal to a logic system which controls the driver translators such that the driver mechanisms adjust the gimbal until the surface of the wafer is parallel to the established reference plane.

DESCRIPTION OF THE DRAWINGS

These and other features, objects and advantages of the present invention will be more fully realized from the following description of the drawings in which:

Referring now to the Figs. there are depicted different views of an apparatus 10 constructed in accordance with the present invention. The apparatus generally comprises an adaptor ring 11 in the form of a L-shaped ring having an inner step 11a on which there are at least three, equally spaced, internally extending ears 12. Adjacent to each of these ears 12 is a driver mechanism 13. In FIG. 1, for purposes of clarity, only two of the driver mechanisms 13 are shown complete. Each driver mechanism 13 comprises a driver translator 14, a Z-shaped driver arm 15 and a driver pin 16. Each pin 16 extends through a respective ear 12. Also located in each ear 12 is a sensor 17.

Figure 1:
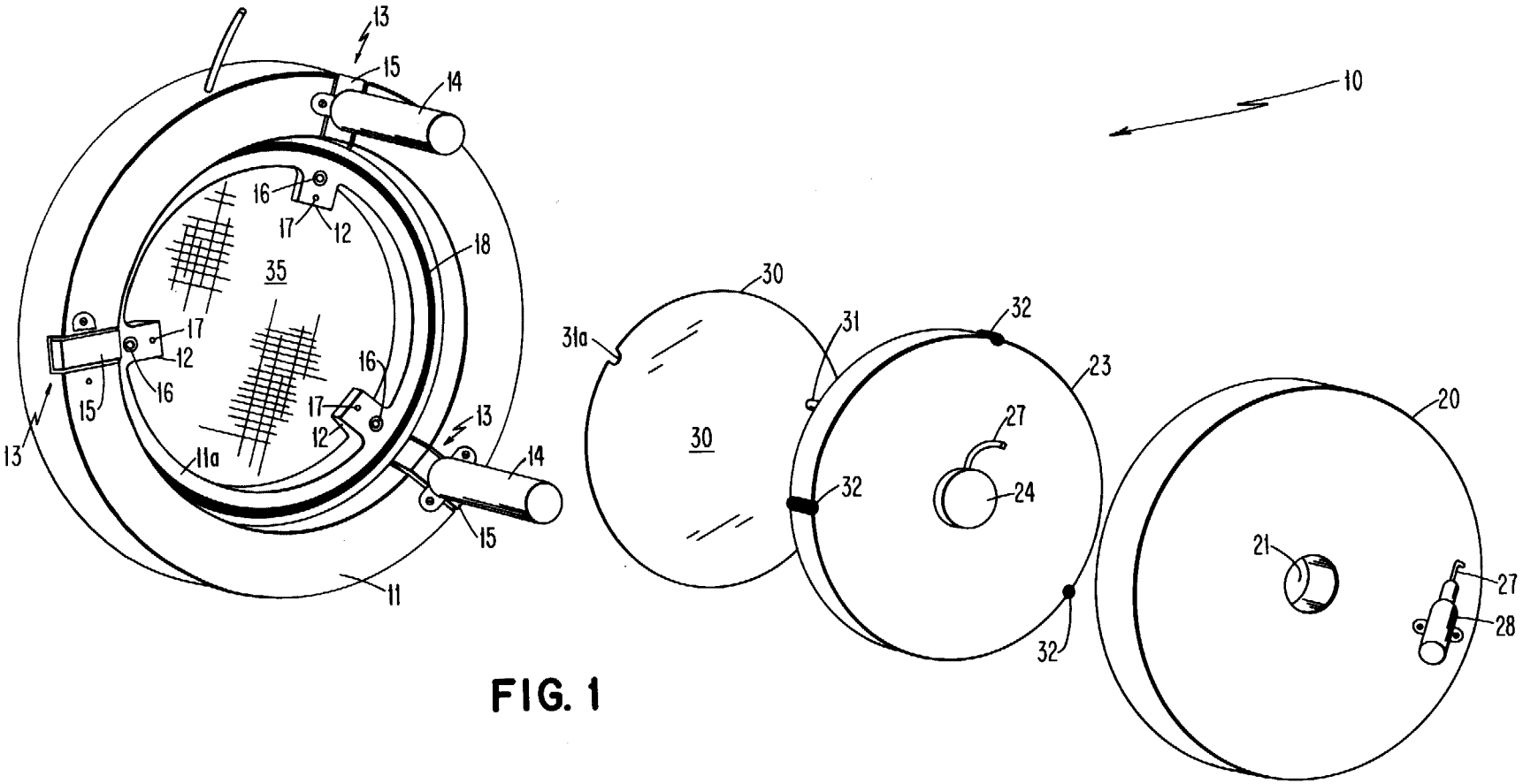
FIG. 1 is a partially exploded view of a preferred embodiment of the invention.
Figure 2:
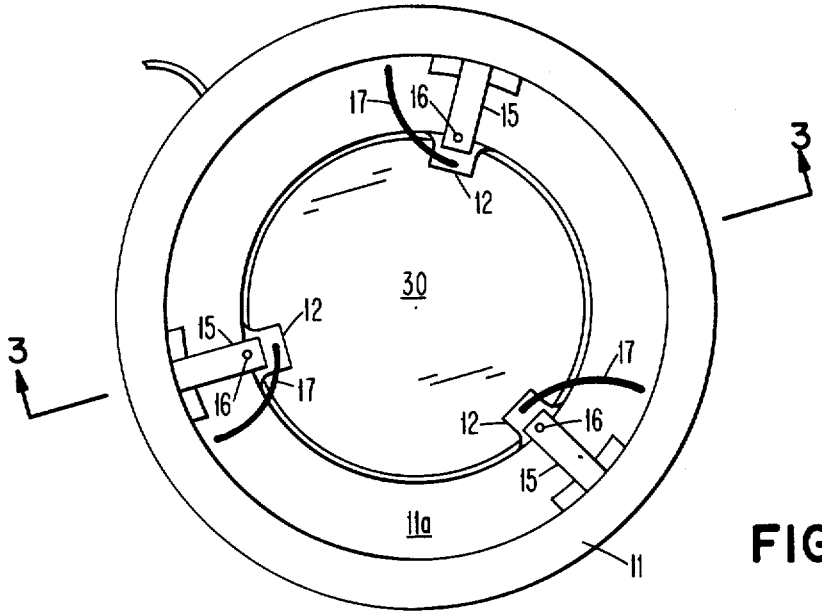
FIG. 2 is a back view of the adaptor mated with the wafer holder.
Figure 3:
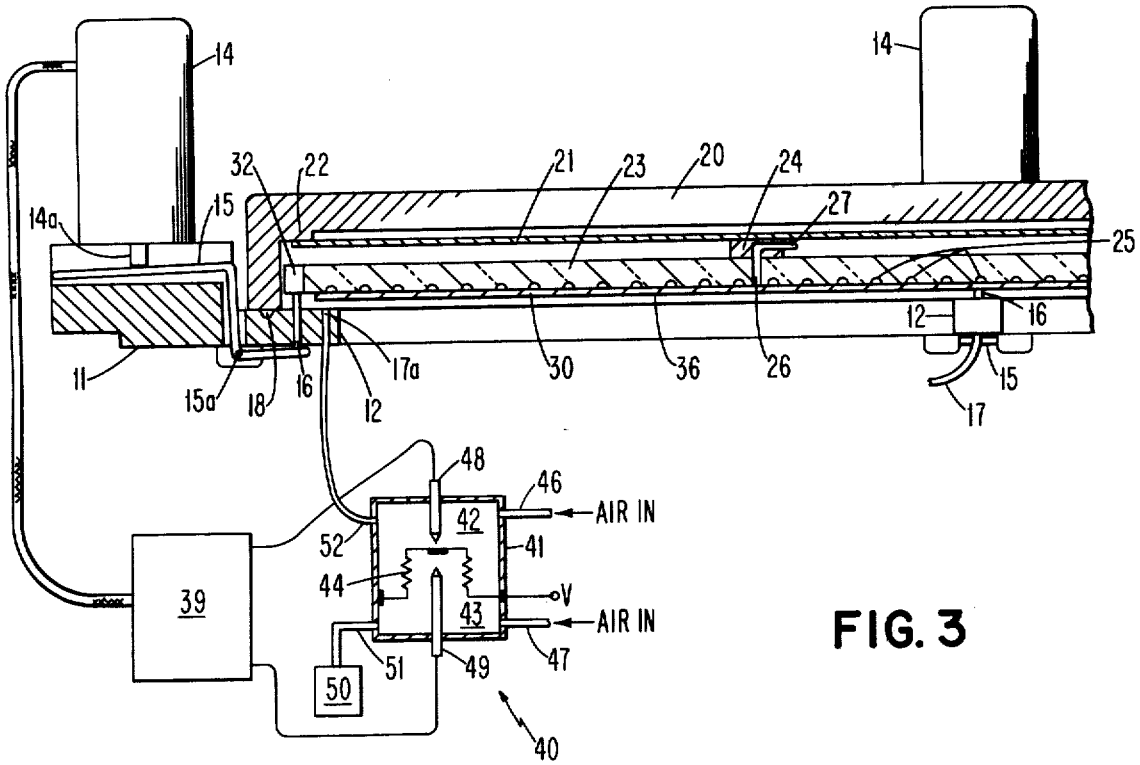
FIG. 3 is a partial inverted sectional view of FIG. 2 taken along the lines 3—3.

A vacuum channel 18 extends around the perimeter of the inner step 11a between the ears 12 and the main body of the ring 11.

A cup shaped chuck 20 has disposed therein a diaphragm spring 21 that is secured by its edges to a shoulder 22 in the chuck 20. Thus space is provided between the spring and the body of the chuck providing the spring room to flex. A glass disc 23 serves as a wafer holder and is secured to the center of the diaphragm spring 21 via a central pedestal 24. By centrally securing the disc to the diaphragm spring both translational and rotational freedom of motion is given the disc 23. The disc 23 is provided with a plurality of radial and circular channels 25 which connect to a central channel 26 provided in the pedestal 24. This central channel is connected by a suitable hose 27 to a vacuum source inlet 28. By drawing a vacuum through these channels a wafer 30 can be tightly secured against the surface of the disc 23. The disc 23 further is provided with a wafer locating pin 31 and a plurality of metallic lugs 32. These lugs 32 are disposed around the periphery of the disc 23 and each is arranged to align with a respective one of the driver pins 16 in the adaptor ring when the chuck 20 is mated with the ring 11. The wafer 30 is provided with a notch 31a which will align with the alignment pin 31. Located in back of the adaptor ring 11 is a photomask 35 which is to be projected, by any suitable optical projection system (not shown), onto the aligned wafer.

The various steps in the operating sequence for aligning the semiconductor wafer with respect to the reference plane are set forth below to facilitate understanding of the apparatus.

The wafer 30 has one surface coated with a layer of photoresist 36 and is placed upon the wafer holding disc 23 so that the photoresist layer 36 faces away from the disc 23 and a suitable vacuum source (not shown), is connected to the inlet 28 so that a vacuum is drawn in the channels 25 to hold the wafer tightly against the surface of the disc 23. Once the wafer is suitably aligned on the disc 23 the chuck 20 is inserted into and mated with the adaptor 11, the chuck 20 is held securely in the adaptor 11 by butting the face of the chuck 20 against the step 11a and drawing a vacuum in channel 18 provided in the inner step 11a of adaptor 11. This vacuum channel 18 holds the chuck securely against the adaptor. The wafer holding disc 23 can now be positioned to any desired attitude within the chuck 20 by means of the driver mechanisms.

Once the chuck 20 is securely mated in the adaptor 11 and held on the inner step 11a by means of a vacuum in the channel 18 the sensors 17 are activated to define the relationship of the wafer surface with respect to a reference plane. Each of such sensors can be, for example, an air sensor which includes a proximity switch 40, responsive to small pressure changes, and a suitable logic controller circuit 39 coupled to the proximity switch. Such circuits and switches are well known to the art. One such switch basically comprises a body 41 containing upper and lower chambers 42 and 43 respectively separated by a conductive bellows 44 coupled to a suitable voltage source V. Air inlet ports 46 and 47 are provided to the chambers 42 and 43 respectively defined by the bellows. In each chamber is a respective electric contact 48 and 49. The lower chamber 43 has a controlled bleeder valve 50 attached to its exit port 51 so as to precisely control the air pressure within the chamber. The exit port 52 of the upper chamber 42 is coupled to a respective ear 12 on the inner step 11a and serves as a sensor 17.

These sensors 17 can be set to detect the distance an object is positioned from the mouth 17a of the sensor 17 by the following technique. A bleeder valve 50 on the switch 40 is opened fully. A mechanical stop (not shown), which simulates the wafer is mechanically set the desired distance from the mouth of the sensor 17 and air, of suitable pressure introduced into the upper and lower chambers 42 and 43 through the respective inlets 46 and 47. The stop across the mouth of the sensor causes a back pressure to be created in the upper chamber 42 causing the bellows 44 to be compressed towards the contact 49. The bleeder valve 50 is now adjusted to increase the back pressure in the lower chamber 43 until the bellows 44 is positioned midway between the two contacts 48 and 49.

When the stop is removed and an object is placed before the mouth the sensor, if the object is closer to the mouth of the sensor than was the stop the pressure increases in the upper chamber and the bellows is forced down to touch the lower control energizing the lower contact. Thus it can be determined if the object is closer to the sensor mouth than was the preset stop used to originally set the sensor. Conversely when the object is placed further from the mouth of the sensor than was the stop the pressure in the upper chamber decreases and the bellows expands to touch the upper contact 48. Thus it can be established that the object is farther from the mouth of the sensor than was the preset stop.

In the present apparatus by providing such a sensor in each inwardly extending ear 12 and setting each sensor to detect units a selected distance for the sensor a specific reference plane, a selected distance from the ears can be established.

The contacts 48 and 49 of the switch 40 are coupled to the controller circuit 39 which in turn is connected to the driver translator 14 to drive the translator 14 such that the pin 16 will be forced up through the ear when an object is too close to the mouth of the sensor and retracted into the ear when the object is too far from the mouth of the sensor.

Initially when the chuck is not mated with the adaptor ring, the translators 14 are set so that the pins 16 are extended out of the ears 12. When the chuck 20 containing a wafer 30 is placed into the adaptor 11 the diaphragm spring 21 pushes the disc 23, and thus the wafer 30, towards the mouth of each sensor. However, because of the extended pins 16 the spring 21 cannot force the wafer up to the preset reference plane. This spacing is detected by the sensors which activate via the controller circuit the necessary driver translators 14 such that the central shaft 14a of each translator is retracted. The spring force acting through the lugs 32 and the pins 16 forces each respective driver arm 15 to rotate around its pivot point 15a located below the adaptor step 11a, and the disc 23 is forced down until it reaches the preset reference plane. However, if for some reason the wafer passes the preset reference plane its closeness is detected by the sensors which cause the central shaft 14a of the necessary translators to be again extended forcing each respective driver arm 15 to rotate around its pivot point 15a located below the adaptor step 11a, and extend each respective pin 16 up, out of the ear 12, and against each respective lug 32 mounted on the edge of the disc 23. In this case the pins 16 force the disc 23 back up against the spring 21 until it reaches the reference plane. Thus by controlling each transducer the wafer can be placed in the desired reference plane.

The driver translator can be, for example, an electromechanical actuator such as piezoelectric transducer. Such devices are well known to the prior art and basically comprise three distinct sections of piezoelectric cylinder which is fitted around a low expansion invar spindle keyed to prevent rotation. The cylinder is basically constructed so that the end sections will clamp the shaft at appropriate times while the midsection provides the motion to the shaft. When the voltage is applied to the end section of the cylinder it changes dimension slightly and clamps the shaft. Next a staircase voltage is applied to the center section to change its length in discreet steps. When the staircase reaches its upper limit the logic commands the other end section of the cylinder to clamp the shaft and release the first section and starts the staircase back down on this intersection. This draws one end of the cylinder toward the other end causing the shaft and spindle to be moved along in the appropriate direction. This results in travel in a sequence of linear motions of very small increments stopping for a brief time and then moving linearly again. This staircase can be stopped at any step or count so that positioning resolution can be as small as a single step, in the present case 6 microinches. The transducer can be programmed to run forward or backwards, to run continuously at various speeds, to run as long as the sensor provides information or to take single steps.

Preferably, as shown in the drawings, at least three sensors are utilized to define a single reference plane which place is established as described and to assist in positioning the wafer in the reference plane. In most photoalignment systems such a reference plane is set parallel to the photomask. By using different sensors, i.e. optical and especially scanning sensors, it is possible to cause the wafer to be continually adjusted in its position. Such continual adjustment would be especially useful when a scanning electron beam is being used to define the information in the photoresist on the semiconductor wafer. Such continual adjustment can also compensate for undulations in the wafer without introducing additional transitory, and uncontrolled stresses in the wafer. By utilizing a driver mechanism which moves the wafer by driving against lugs on the disc holding the wafer, in response to information received from sensors which sense the surface of the wafer, mechanical contact with the exposed photoresist coated surface wafer is avoided. Thus damage to the photoresist by mechanical touching is prevented. Furthermore, the necessity of continuously cleaning the adaptor ring encountered by prior art units is also eliminated. Moreover, even in the event that small particles get trapped between the wafer and the holder 20 the position of the wafer with respect to the reference plane will still be maintained for it is the surface of the wafer that is being sensed. Additionally, since the sensors constantly monitor the distance the wafer is from the reference plane the transducers maintains constant physical contact with the lugs 32 thus assuring that the wafer is constantly maintained in the preferred position with respect to the reference plane. This constant monitoring and provision of contact adjustment permits temperature changes or other transitory effects to be compensated for. In addition to the piezoelectric means describes stepping motors or any other suitable means of making or maintaining small displacements could be used. Additionally the object being positioned need not be a flat wafer but could assume other shapes such as, for example, a hemisphere.

In summary; the drive and sense assemblies are attached to the adaptor such that when a wafer is on the chuck and the chuck is mated with the adaptor the position of the front side of the wafer with respect to a reference plane is sensed, by suitable units coupled to drive assemblies that positions the wafer by moving the holder on which it is held until all the sensors which are sensing the surface of the wafer are satisfied. At this point alignment of the wafer with respect to the reference plane is complete.

Although a preferred embodiment has been described herein it should be obvious to those skilled in the art that the invention may be carried out in various ways and may take various forms of embodiments other than those described above without departing from the spirit and scope of the invention and that the method is in no restricted by the device.

What is claimed is:

1. A mechanism for positioning the surface of an object in a selected position with respect to a reference plane comprising:

means for holding said object, means for defining said reference plane, *an adapter ring for mating with said holding means,* driver means *mounted on said adapter ring and* aligned with said holding means, and sensor means coupled to said driver means and spaced from said object for sensing the surface of said object with respect to said reference plane and controlling respective ones of said driver means to engage and move the holding means to position the sensed surface of said object in said selected position with respect to said reference plane[.] *said holding means comprising a chuck enclosing a spring loaded mounting means provided with means for holding an object having a flat surface thereon, and*

*said driver means being aligned with said mounting means to position the sensed surface of the object by moving said mounting means against said spring.*

2. A mechanism for positioning and maintaining the plane surface of a unit in a selected attitude with respect to a reference plane comprising:

a unit having a plane surface to be positioned,

*a spring loaded mounting* means for holding said unit, a carrier adapted to mate with said holding means, driver mechanisms on said carrier aligned with said holding means when mated with said carrier, means coupled to said carrier defining said reference plane, and sensors on said carrier being coupled to said driver mechanisms and spaced from said surface of said unit for sensing the position of said surface and controlling said driver mechanisms to engage and move said holding means to position and maintain the sensed surface of the unit in said selected attitude with respect to said reference plane.

[3. The mechanism of claim 1 wherein there is further provided an adaptor ring supporting said driver means and said sensor means, said driver means and said sensor means being equally spaced on said ring.]

4. The mechanism of claim [3] *1* wherein said adaptor ring has an inner step, said step being provided with means for securing said means for holding said object in said adaptor ring.

[5. The mechanism of claim 4 wherein said means for holding said object comprises a cup shaped chuck enclosing a spring loaded, moveable mounting means.]

6. The mechanism of claim [5] *1* wherein said mounting means comprises a disc provided with a plurality of radial and circular channels connected to a vacuum source for holding an object having a flat surface thereon.

7. The mechanism of claim [5] *6* wherein said mounting means is spring loaded by a diaphragm spring that provides translational and rotational freedom of motion to said mounting means.

8. The mechanism of claim 7 wherein each of said sensor means comprises a dual action air switch which can establish the surface of the object parallel to said reference plane.

9. The mechanism of claim 8 wherein each of said sensors are coupled to respective driver means through a controller circuit.

10. A mechanism for positioning the plane surface of a unit in a selected position parallel to a reference plane comprising:

a unit having a surface to be positioned, a chuck, a moveable mounting means in said chuck for holding the unit, said moveable mounting means being provided with a plurality of lugs around its periphery, a carrier adapted to mate with the chuck, a plurality of driver mechanisms on said carrier each of which is aligned with a respective one of said lugs on the periphery of said mounting means when the carrier is mated with the chuck, and means on said carrier defining a reference plane, a plurality of sensors being spaced from the surface of the unit when the carrier is mated with the chuck for sensing the position of the surface relative to the reference plane, each sensor being coupled to and controlling respective one of said driver mechanisms to engage and drive the lugs on the mounting means to position and maintain the sensed plane surface of the unit parallel to the reference plane, said moveable mounting means being spring loaded in said chuck providing translational and rotational freedom of movement to said mounting means in said chuck.

11. In a photoalignment tool a wafer positioner for positioning a wafer in a predetermined plane comprising:

an adaptor ring supporting spaced driver mechanisms and sensor units, a chuck housing mated with said adaptor ring, and means having translational and rotational freedom of movement mounted in said chuck housing, for holding a wafer adjacent to said sensor units, said sensor units detecting the distance between the wafer surface and the adaptor ring, said sensors being coupled to said driver mechanisms to control the driver mechanisms to engage and drive the means mounted in said housing to position and maintain the wafer in a selected plane with respect to the adaptor ring.

* * * * *